(12) United States Patent
Yang

(10) Patent No.: US 7,009,222 B2
(45) Date of Patent: Mar. 7, 2006

(54) PROTECTIVE METAL STRUCTURE AND METHOD TO PROTECT LOW-K DIELECTRIC LAYER DURING FUSE BLOW PROCESS

(75) Inventor: Chao-Hsiang Yang, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 57 days.

(21) Appl. No.: 10/831,008

(22) Filed: Apr. 22, 2004

(65) Prior Publication Data

US 2005/0239273 A1     Oct. 27, 2005

(51) Int. Cl.
*H01L 31/111* (2006.01)

(52) U.S. Cl. .............. 257/127; 257/257; 257/170; 257/529; 257/665; 438/601

(58) Field of Classification Search ............. None
See application file for complete search history.

(56) References Cited

U.S. PATENT DOCUMENTS 6,100,116 A * 8/2000 Lee et al. .............. 438/128

* cited by examiner

*Primary Examiner*—David Nelms
*Assistant Examiner*—Long Tran
(74) *Attorney, Agent, or Firm*—Tung & Assoc.

(57) ABSTRACT

A method to protect a low-K IMD layer underlying a fuse link during a fuse blowing process including a guarded fuse and method for forming the same including forming a fuse portion comprising two metal fuse interconnect structures and a guard ring comprising a metal interconnect structure surrounding the fuse portion in an uppermost IMD layer comprising a dielectric constant of less than about 3.2; forming a protective metal portion electrically isolated in the uppermost IMD layer to cover at least a portion of an area extending between the fuse portions; forming at least one overlying dielectric insulating layer over the uppermost layer to include extended portions of the fuse portion and the guard ring; and, forming a metal fuse link portion to electrically interconnect the fuse portion wherein the fuse portion overlies at least a portion of the protective metal portion.

10 Claims, 3 Drawing Sheets

PROTECTIVE METAL STRUCTURE AND METHOD TO PROTECT LOW-K DIELECTRIC LAYER DURING FUSE BLOW PROCESS

FIELD OF THE INVENTION

This invention generally relates to semiconductor processing methods including formation of multiple layer semiconductor devices and more particularly to a structure and method for forming a protective metal portion to protect low-K dielectric layers from delamination during a fuse blow process.

BACKGROUND OF THE INVENTION

Fuses are frequently used to reconfigure memory and logic circuitry. For example, in dynamic or static memory chips, defective memory cells or circuitry may be replaced by blowing fuses associated with the defective circuitry while activating redundant circuitry to form new memory circuitry. This circuit rerouting using blowable fuse links contributes to enhanced yields without the necessity of scrapping defective process wafers.

Generally, fuse links, made of a conductive material, such as a metal may be blown or removed by passing an excessive current through the circuitry which melts the fuse link or exposing the fuse link to intense laser irradiation to ablate the fuse link including a window of thin transparent layer of oxide insulating material above the fuse link.

Frequently, it is more desirable to use the laser ablation method since it is faster, more accurate and leaves less residue within the fuse link window area. However, as device sizes decrease to 0.25 microns and below it is increasingly desirable and necessary to use multi-level device circuitry to achieve the desired circuit density. Low-K (low dielectric constant) materials have become necessary in the formation of dielectric insulating layers, also referred to as inter-metal or inter-level dielectric (ILD/IMD) layers in order to reduce capacitance and therefore speed signal transport. Low-K materials may include porous inorganic silicon oxide based materials such as carbon doped oxide also known by trade names such as BLACK DIAMOND™ and SILK™.

One problem with the use of low-K materials is the poor adhesive strength of such materials which are susceptible to delamination in the presence of induced stresses including thermal mismatch stresses. Guard rings have been proposed for use around fuse areas to prevent the migration of contamination from the fuse area into surrounding dielectric insulating areas following the 'blowing' of fuses to reconfigure the device circuitry.

For example U.S. Pat. No. 5,729,041 (Yoo et al.) describes a structure and method of forming a fuse link and fuse window area having a protective layer formed over them. The protective layer is highly transmissive to intense laser light while it is protective of the fuse and the surrounding insulating layers.

U.S. Pat. No. 5,567,643 (Lee et al.) describes a method for creating a guard ring surrounding a fuse area. The guard ring prevents contaminants from diffusing through a window opening above a fuse link to adjacent semiconductor devises. The guard ring is an annular metal ring that penetrates two or more insulating layers.

U.S. Pat. No. 6,319,758 (Liaw et al.) describes a method for forming a fuse area including use of a hard mask to facilitate destruction of a conductive fuse link.

U.S. Pat. No. 6,295,721 (Tsai et al.) describes a method for forming a fuse link from a compound layer of aluminum and chromium. The fuse link is shaped to form a stripe that bridges a gap between two copper dual damascene connectors. By controlling the degree of overlap between the stripe and the connectors, the conductance of heat from the stripe into the connectors can be varied, thereby allowing control of the manner in which the fuse blows when subjected to heating.

U.S. Pat. No. 6,100,118 (Shih et al.) describes a method and structure for forming a multi-layer guard ring structure around a fuse area that extends through multiple dielectric layers to an upper metallization layer.

One problem not addressed or solved by the prior art including the above cited references is the problem of damage including delamination to low-K dielectric insulating layers underlying the fuse link during the laser ablation or current heating process to blow the fuse links.

Therefore, there is a need in the semiconductor processing art to provide a structure and method of forming fuses such that the fuse link portions of a fuse may be removed while avoiding damage to underlying dielectric insulating layers.

It is therefore an object of the invention to provide a structure and method of forming fuses such that the fuse link portions of a fuse may be removed while avoiding damage to underlying dielectric insulating layers in addition to overcoming other shortcomings of the prior art.

SUMMARY OF THE INVENTION

To achieve the foregoing and other objects, and in accordance with the purposes of the present invention, as embodied and broadly described herein, the present invention provides a guarded fuse structure and method for forming the same to protect an underlying low-K IMD layer during a fuse blowing process.

In a first embodiment the method includes forming a fuse portion comprising two metal fuse interconnect structures and a guard ring comprising a metal interconnect structure surrounding the fuse portion in an uppermost IMD layer comprising a dielectric constant of less than about 3.2; forming a protective metal portion electrically isolated in the uppermost IMD layer to cover at least a portion of an area extending between the fuse portions; forming at least one overlying dielectric insulating layer over the uppermost layer to include extended portions of the fuse portion and the guard ring; and, forming a metal fuse link portion to electrically interconnect the fuse portion wherein the fuse portion overlies at least a portion of the protective metal portion.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained in exemplary implementation with respect to particular multi-level fuse interconnect structure with a surrounding multi-level guard ring structure, it will be appreciated that the number of IMD layers through which the guard ring structure and the fuse interconnect structure respectively extend through may vary, for example the guard ring structure varying in depth relative to the fuse interconnect structure, for example extending through fewer IMD layers toward the semiconducting substrate, and extending into IMD layers formed above the fuse link level.

It will additionally be appreciated that the metallization levels including interconnecting vias may be formed by single or dual damascene processes where the metallization layers may include different metals or conductive material in each metallization layer. For example, the guard ring structure surrounding the fuse link area and the fuse interconnect structures may be formed of any metal including alloys of copper, tungsten, and aluminum as well as including etch stop layers such as metal nitrides or metal oxynitrides between IMD layer portions and barrier/adhesive layers lining the filled metal damascenes at the IMD layer interface.

Figure 1A:
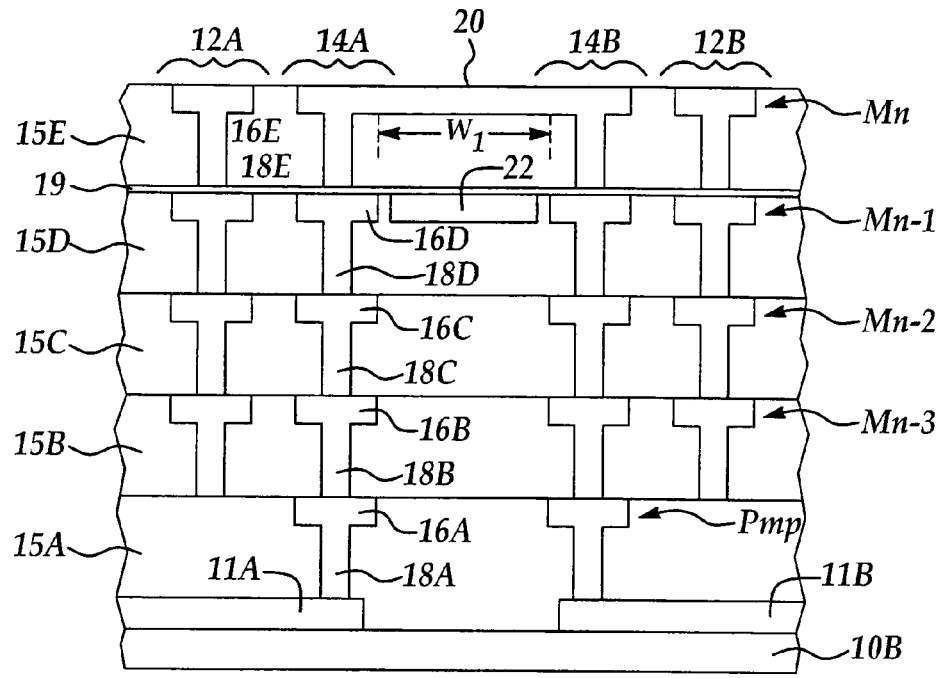
FIG. 1A is a cross sectional view of a fuse link area including a surrounding guard ring structure and a protective metal portion according to an embodiment of the present invention.

For example, referring to FIG. 1A is shown a cross sectional portion including a fuse area in a multi-level semiconductor device including multiple metallization levels, e.g., Mn-3, Mn-2, Mn-1, and Mn together with associated vias. For example, 12A and 12B indicated cross sectional portions of a guard ring structure formed from stacked conductive, e.g., metal, interconnect portions surrounding fuse interconnect structures e.g., 14A and 14B also formed from stacked conductive e.g., metal interconnect portions. For example, the guard ring structure and fuse interconnect structures are formed in parallel to extend through a first plurality of low-K inter-metal dielectric (IMD) layers e.g., 15B, 15C and 15D. For example, the fuse interconnects 14A and 14B extend downward to make electrical contact with conductive lines formed over a substrate. For example, the fuse interconnect portions 14A, 14B are electrically interconnected to extend through one or more IMD layers, e.g., 15A, for example frequently referred to as a pre-metal dielectric (PMD) layer, formed of an oxide, for example, doped or undoped TEOS oxide, extending below the guard ring structure e.g. 12A and 12B, to make electrical contact with conductive lines, for example polysilicon or polycide lines 11A and 11B formed overlying field oxide region 10B which in turn overlies silicon substrate 10A.

For example, each of the metallization levels and associated vias forming a portion of the fuse interconnect structures e.g., 14A and 14B and the guard ring structure e.g., 12A and 12B include a metal interconnect line (pad) portions (e.g. trench lines or pads) e.g., 16A, 16B, 16C, and 16D forming metallization layers and inter-connected by via portions, e.g., 18A, 18B, 18C, 18D, the via portion together with respective metal interconnect portions forming dual damascene structures. The metal interconnects including via portions in may be formed by known methods including methods for forming copper dual damascene structures to include a via portion and a metal interconnect (trench line) portion in the same or separate IMD layers separated by etch stop or capping layers (not shown). It will be appreciated that the metallization levels including lower metallization levels e.g., PMD level and associated vias may be formed of tungsten or aluminum while upper levels including associated vias, e.g., Mn-2 and Mn-1 may be formed of copper.

Preferably the fuse interconnect structure e.g., 14A, 14B are formed to extend through a first thickness of the plurality of low-K IMD layers e.g., 15A, 15B, 15C, 15D, and the guard ring structure e.g., 12A, 12B extending through a second thickness of the plurality of low-K IMD layers e.g., 15B, 15C, 15D. In addition, a portion of the guard ring and fuse interconnect structure are preferably formed to extend through at least one overlying conventional IMD oxide layer, e.g., 15A, for example undoped silicate glass. For example, suitable inorganic low-K materials for forming the first (lower) plurality of low-K IMD layers e.g., 15B, 15C, and 15D, include carbon doped oxide, for example, BLACK DIAMOND and SILK may be suitably used to form the low-k IMD layers. Preferably, each of the inorganic low-K dielectric IMD layers has a dielectric constant of less than about 3.2. Above Mn-1 metallization layer formed in uppermost low-K IMD layer e.g., 15D, is formed at least one overlying IMD layer e.g., 16E, and metallization layer Mn together with associated via portions e.g., 18E extending through at least one overlying IMD layer, e.g., 15E formed of a conventional IMD oxide layer material, for example undoped silicate glass (USG) or TEOS silicon oxide. Optionally, a capping layer e.g., 19, for example formed of silicon nitride or silicon oxynitride preferably separates the Mn-1 metallization layer formed in the uppermost low-K IMD layer e.g., 15D from an overlying conventional oxide IMD layer e.g., 15E.

Still referring to FIG. 1A, fuse link portion 20 is shown electrically interconnecting fuse interconnect portions 14A, 14B formed in top metal layer Mn. For example, fuse link portion 20 is formed in an overlying IMD layer (not shown) to electrically bridge the fuse interconnect structures 14A and 14B. The fuse link structure 20 may be formed of any metal but is preferably formed of aluminum, tungsten, chromium or alloys thereof, including multiple layers of such metals.

Still referring to FIG. 1A, according to the present invention, a protective metal portion 22 is included in the uppermost low-K IMD layer, e.g., 15D, forming a portion of the Mn-1 metallization layer, preferably positioned to cover from about 33% to about 95% of an area portion (shown in cross section as width W1) underlying the bridging portion of the fuse link structure 20. In one embodiment, the protective metal portion 22 is formed by forming one or more electrically isolated widened trench lines (metal plates) between the fuse interconnect structures 142A and 14B in the Mn-1 metallization layer (formed in the uppermost low-K IMD layer e.g., 15D). For example, the protective metal portion 22 is formed by forming a single widened trench line portion in metallization layer Mn-1, to extend across a width area W1 equal to between about 33% to about 95% of the width of the fuse link structure 20 bridging the fuse interconnect structures 14A and 14B to include encompassing an area portion underlying the fuse link 20. For example, the protective metal portion 22 preferably covers from about 33% to about 95% of the area underlying the bridging portion of the fuse link 20. It has been found that the protective metal portion 22 reduces the incidence of delamination and damage to low-K IMD layers, e.g., 15D underlying the fuse link 20 during a fuse blowing process, particularly a laser irradiation fuse blowing process. It is believed that the protective metal portion acts to dissipate a portion of incident heating due to incident laser light or current passed through the fuse link structure 20 during a fuse blowing (electrical path interruption) process thereby reducing thermally induced stress to the underlying low-K IMD layers, e.g., 15D.

Figure 1B:
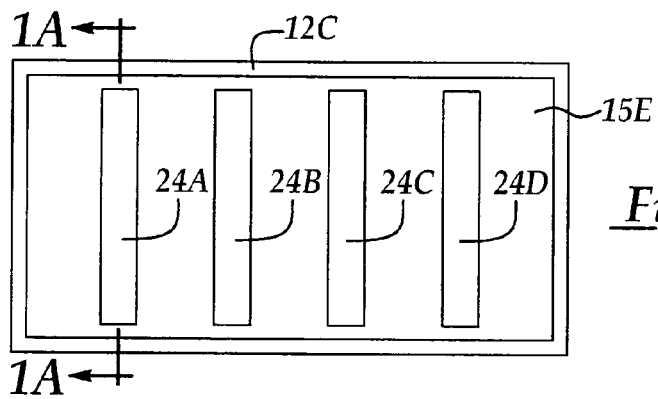
FIG. 1B is a top planar view of a fuse link area showing fuse links in a metallization layer according to an embodiment of the present invention.

Referring to FIG. 1B is a top planar view of an exemplary fuse link area showing fuse links 24A, 24B, 24C, and 24D where the cross section in FIG. 1A is shown taken through line 1AA. Surrounding the fuse link area is shown guard ring structure e.g., 12C formed in metallization layer Mn, shown in cross section as 12A and 12B in FIG. 1A. For example, the width portion of the guard ring 12C in metallization layer Mn is from about 0.25 microns to about 1 micron and the width of the fuse links e.g., 24A is from about 0.25 microns to about 5 microns, whereas the length of the fuse links e.g., 24A is about 1 micron to about 5 microns. The thickness of the fuse link e.g., referring to 20 in FIG. 1A may range from about 1000 Angstroms to about 5000 Angstroms.

Figure 1C:
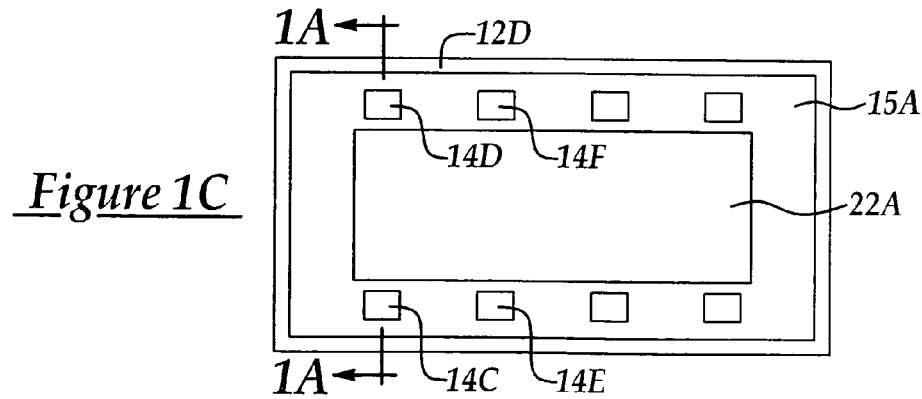
FIG. 1C is a top planar view of a fuse link area showing the protective metal portion formed underlying the fuse links in an uppermost low-K dielectric layer according to an embodiment of the present invention.

Referring to FIG. 1C is shown a top planar view of the Mn-1 level underlying IMD layer 15E and the Mn level shown in FIG. 1B. The guard ring portion in the Mn-1 level is shown as 12D and the fuse metal interconnect portions are shown as e.g., 14C, 14D and 14E, 14F. The protective metal portion underlying the bridging portion of the fuse links, shown as 22 in FIG. 1A, is shown as 22A in FIG. 1B. The protective metal portion e.g., 22A forms an electrically isolated metal plate portion extending between the fuse interconnect portions e.g., 14C, 14D and 14E, 14F in the Mn-1 plane. The protective metal portion e.g., 22A may be formed from any metal but is preferably formed of copper, aluminum, tungsten, or alloys thereof. Preferably, the protective metal portion e.g., 22A is formed of the same metal as the guard ring and the fuse interconnect structure, for example formed in parallel in metallization layer Mn-1. For example, if the guard ring structure and the fuse interconnect structure are formed of copper, the protective metal portion e.g., 22A is preferably likewise formed of copper including formation of metal nitride barrier layers prior to copper deposition, for example by electrochemical deposition (ECD) followed by CMP and deposition of an overlying metal nitride capping layer.

Figure 2A:
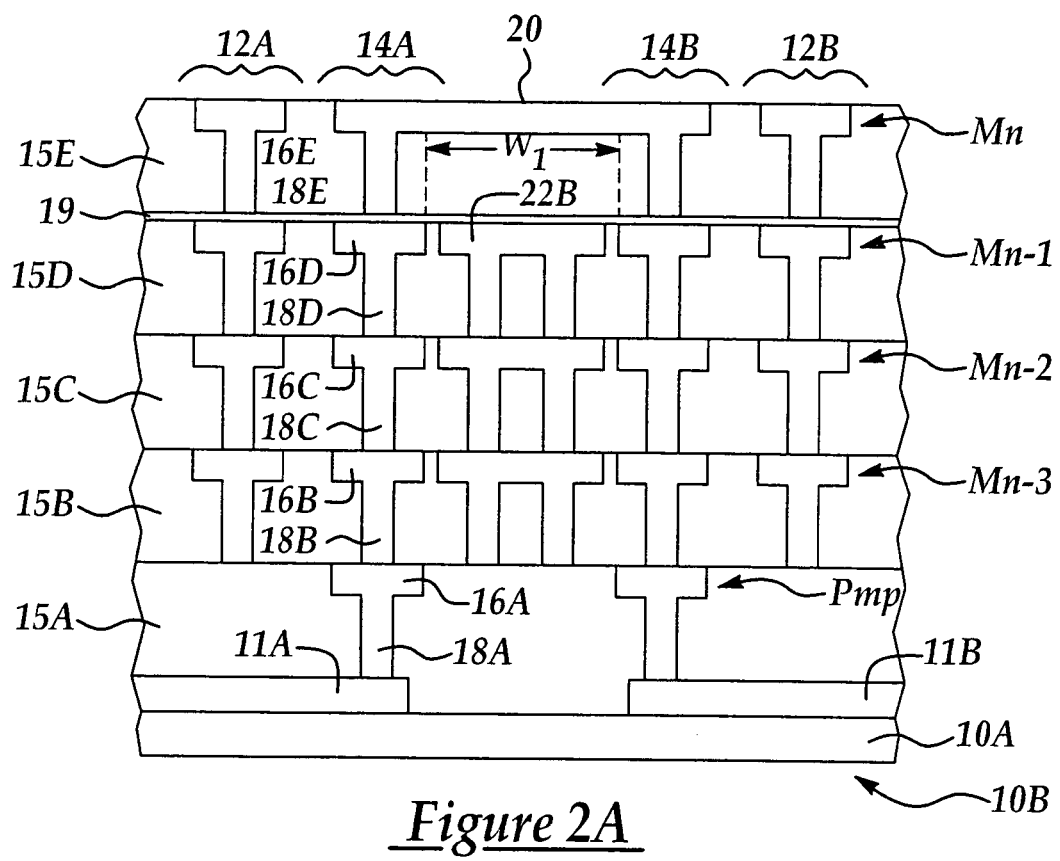
FIG. 2A is a cross sectional view of a fuse window area including a surrounding guard ring structure and a protective metal portion in the form of a second guard ring structure according to an embodiment of the present invention.
Figure 2B:
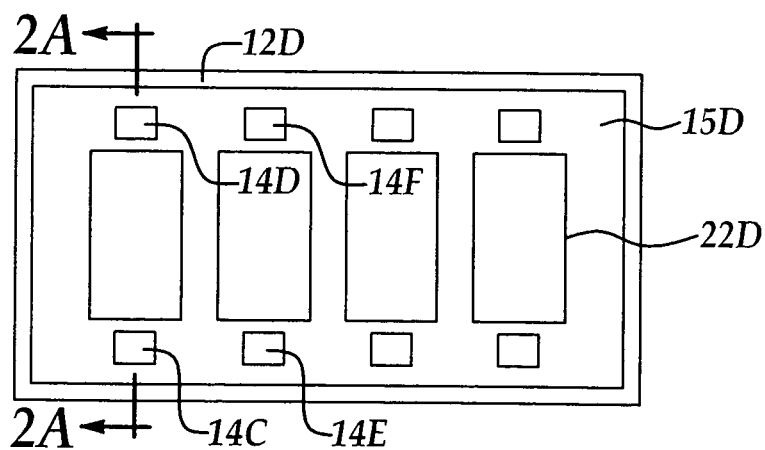
FIG. 2B is a top planar view of a fuse link area showing the protective metal portion in the form of a second guard ring formed underlying the fuse links in an uppermost low-K dielectric layer according to an embodiment of the present invention.

Referring now to FIG. 2B wherein a different protective metal structure is shown. The main difference is that protective metal is separated under individual fuse.

FIG. 2A is a cross-sectional view of another embodiment wherein a protective metal portion is formed in an upper low-K IMD layer in the Mn-1 metallization layer underlying the bridging portion of the fuse link 20. It is similar to the structure of FIG. 1A except that an additional isolated metal plate and a via are added to each low K IMD layer in order to provide a stronger structure. In this embodiment, the protective metal portion is formed in a ring structure, seen in cross section as trench line portions e.g., 22B and 22C formed between the multi-layer fuse interconnect structures 14A and 14B in metallization layer Mn-1. For example the thickness of the protective metal ring portions e.g., 22B and 22C may range from about 0.1 micron to about 2 microns and the thickness may range from about 1000 Angstroms to about 5000 Angstroms, preferably formed at the same thickness as adjacent metallization line portions, for example the portion of fuse interconnect structure e.g., 14A and 14B formed in metallization layer Mn-1.

Referring to FIG. 2B is shown a top planar view of the Mn-1 layer showing first guard ring portion in the Mn-1 level 12D surrounding the fuse link area and fuse interconnect portions e.g., 14C, 14D and 14E, 14F. The protective metal portion e.g., 22D is formed in an area of the uppermost low-K IMD layer including the Mn-1 layer e.g., 15D, underlying the bridging portion of the fuse links in the form of a second guard ring, shown as 22B and 22C in cross section in FIG. 2A taken along line 2AA in FIG. 2B. The second guard ring 22D extends horizontally in the Mn-1 plane to at least partially enclose and cover an area in the Mn-1 layer (formed within the uppermost low-K layer e.g., 15D) underlying the fuse links, for example extending between fuse interconnect portions e.g., 14C, 14D and 14E, 14F.

Figure 3:
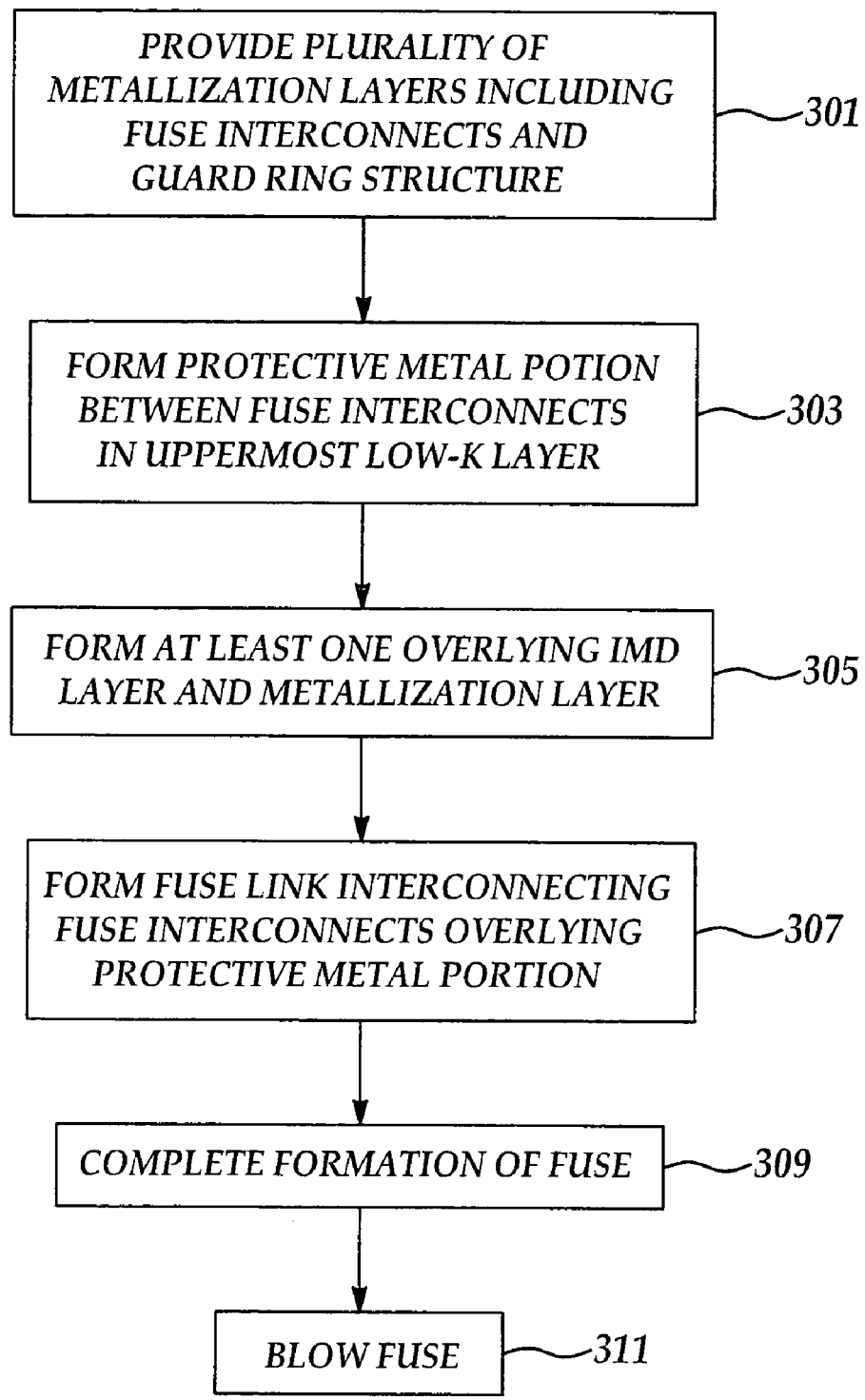
FIG. 3 is an exemplary process flow diagram including several embodiments of the present invention.

Referring to FIG. 3, is shown a process flow diagram including several embodiments of the present invention. In process 301 a plurality of metallization layers including low-K IMD layers are provided including fuse interconnect and guard ring structures. In process 303, a protective metal portion is formed in a metallization layer formed within an uppermost low-K IMD layer, the protective metal portion formed between the fuse interconnect structures to cover an area underlying a subsequently formed overlying fuse link. In process 305, at least one conventional oxide IMD layer, e.g., USG, is formed overlying the uppermost low-K IMD layer to extend the fuse interconnect and guard ring structures. In process 307, a fuse link is formed to interconnect the fuse interconnect structures overlying the protective metal portion. In process 309, the fuse is completed by conventional processes. In process 311, heat is applied, for example by laser illumination to remove (blow) a portion of the fuse link overlying the protective metal portion.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A guarded fuse array with improved heat resistance comprising:
    at least one fuse comprising two conductive fuse interconnect structures extending through a first thickness portion of a plurality of dielectric insulating layers to communicate with a semiconductor device;
    the plurality of dielectric insulating layers comprising a lower plurality of dielectric insulating layers and at least an upper dielectric insulating layer;
    the two conductive fuse interconnect structures being electrically interconnected above the at least an upper dielectric insulating layer by a fuse link portion removable by the application of heat to form the at least one fuse;
    a conductive guard ring interconnect structure surrounding the at least one fuse and extending through a second thickness portion of the lower plurality of dielectric insulating layers and the at least an upper dielectric insulating layer; and, a protective metal portion electrically isolated from the two fuse interconnect structures the protective metal portion formed in the uppermost layer of the lower plurality of dielectric insulating layers and disposed to underlie at least a portion of the fuse link portion.

2. The guarded fuse array of claim 1, wherein the protective metal portion comprises at least one metal trench underlying the fuse link the protective metal portion covering from about 33% to about 95% of an area underlying the fuse link portion.

3. The guarded fuse array of claim 1, wherein the protective metal portion comprises a second guard ring formed to at least partially enclose an area underlying the fuse link portion.

4. The guarded fuse array of claim 1, wherein the protective metal portion is formed of a metal selected from the group consisting of copper, aluminum, tungsten, and alloys thereof.

5. The guarded fuse array of claim 1, wherein the lower plurality of dielectric insulating layers comprises a silicon oxide based low-K material having a dielectric constant of less than about 3.2.

6. The guarded fuse array of claim 1, wherein the lower plurality of dielectric insulating layers is selected from the group consisting of fluorinated silicate glass and carbon doped oxide.

7. The guarded fuse array of claim 1, wherein the at least an upper dielectric insulating layer comprises a silicon oxide based material selected from the group of undoped silicate glass (USG) and TEOS oxide.

8. The guarded fuse array of claim 1, wherein the fuse link portion comprises a metal selected from the group consisting of aluminum, tungsten, chromium, and alloys thereof.

9. The guarded fuse array of claim 1, wherein the protective metal portion comprises at least one metal filled trench formed in an uppermost layer of the lower plurality.

10. The guarded fuse array of claim 1, wherein the at least one fuse comprises an array of fuses and respective fuse links wherein the protective metal portion extends to cover a portion of the area disposed in an uppermost layer of the lower plurality below each of the respective fuse links.

* * * * *